United States Patent [19]

Kingston et al.

[11] Patent Number: 5,060,180

[45] Date of Patent: Oct. 22, 1991

[54] PROGRAMMABLE DIGITAL LOOP FILTER

[75] Inventors: Samuel C. Kingston; Steven T. Barham, both of Salt Lake City; Harold L. Simonsen, West Valley City, all of Utah

[73] Assignee: Unisys Corporation, Blue Bell, Pa.

[21] Appl. No.: 559,014

[22] Filed: Jul. 26, 1990

[51] Int. Cl.[5] ............................................. G06F 15/31
[52] U.S. Cl. ............................................. 364/724.03
[58] Field of Search .................. 364/724.03, 724.17, 364/745; 375/26

[56] References Cited

U.S. PATENT DOCUMENTS

| | | | |
|---|---|---|---|
| 4,727,506 | 2/1988 | Fling | 364/724.03 X |
| 4,807,174 | 2/1989 | Costas | 364/724.03 |
| 4,809,207 | 2/1989 | Nillesen | 364/724.03 |
| 4,879,674 | 11/1989 | Iijima et al. | 364/724.03 |

Primary Examiner—Dale M. Shaw
Assistant Examiner—Tan V. Mai
Attorney, Agent, or Firm—John B. Sowell; Mark T. Starr; Thomas J. Scott

[57] ABSTRACT

A programmable second order loop filter is provided with first and second programmable scaling circuits arranged in parallel and having their outputs connected to first and second programmable one bit serial adders respectively. The output of the second programmable serial adder is coupled to the input of said first programmable serial adder and has its output coupled to the input of a programmable output stage so as to provide the ability to maintain the average quantization bit error to one-half of one bit of the least significant bit of the full loop filter width even though the output does not use or employ all of the significant bits.

13 Claims, 4 Drawing Sheets

PROGRAMMABLE DIGITAL LOOP FILTER

BACKGROUND OF THE INVENTION

1. Field of the Invention

The present invention relates to a novel programmable digital loop filter for a communications receiver. More particularly, the present invention relates to a programmable digital second order loop filter of the type employed in code tracking loops, carrier frequency and phase tracking loops and symbol timing loops.

2. Description of the Prior Art

Heretofore, analog and digital second order loop filters were known. Heretofore, digital loop filters employing large-bit registers at the input stage were coupled directly to large-bit parallel adders. Such input shift registers were adapted to be programmed to provide variable first and second order gain. Such prior art programmable loop filters were adapted to round the output of the parallel adder to a fixed number of bits but were not programmable.

It would be extremely desirable to provide a digital loop filter circuit which is simple, accurate and easily implemented on a very large scale integrated circuit chip, yet has programmable first and second order gain as well as programmable resolution of the filter output.

SUMMARY OF THE INVENTION

It is a primary object of the present invention to provide a novel programmable digital loop filter.

It is a primary object of the present invention to provide a digital second order loop filter having first and second order programmable gain.

It is a primary object of the present invention to provide apparatus for programming the output of a digital loop filter to a desired bit resolution while maintaining full large-bit filter accuracy.

It is a primary object of the present invention to provide a digital loop filter having a programmable output stage which reduces the average quantization bit error to one-half of the least significant bit of the full-bits of the loop filter independent of the number of output bits.

It is a primary object of the present invention to provide a digital loop filter having a large-bit accumulator for high accuracy.

It is another object of the present invention to provide a digital loop filter accumulator having a high speed efficient serial bit adder easily implemented on a very large scale integrated circuit chip.

It is another object of the present invention to provide a digital loop filter having programmable input data scalers for programming first and second order gain of the loop filter so that they may be implemented on a very large scale integrated circuit chip.

According to these and other objects of the present invention a novel programmable digital loop filter has programmable input data scalers for programming first and second order gain and has a programmable output stage which reduces the average quantization bit error to one-half of one bit of the least significant bit of the loop filter width.

DESCRIPTION OF THE PREFERRED EMBODIMENT

Figure 1:
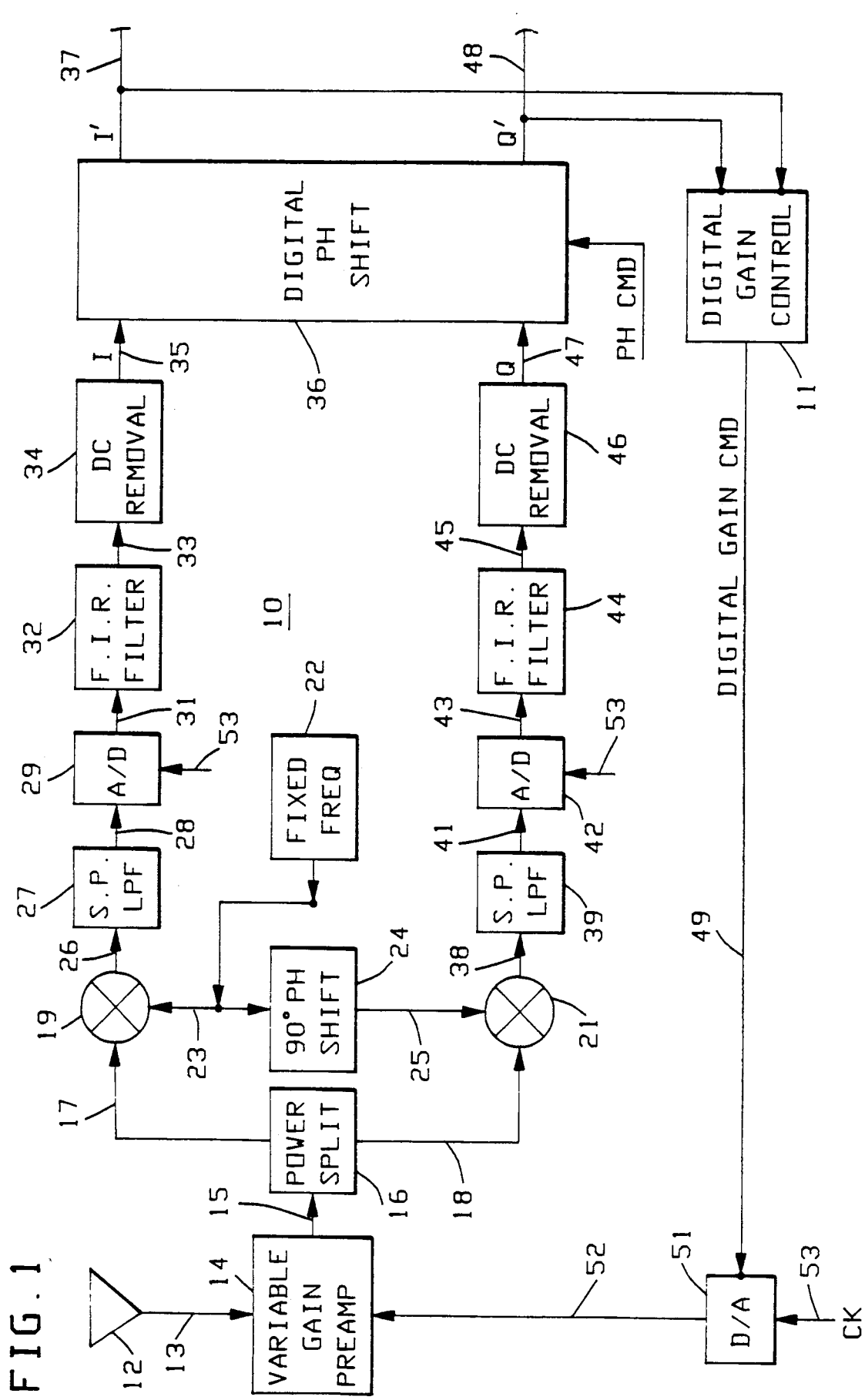
FIG. 1 is a schematic block diagram of a communication receiver pre-processing circuitry illustrating a preferred embodiment use of the present invention programmable digital loop filter.

Refer now to FIG. 1 showing the present invention programmable digital gain controller 11 connected to a data stream of a digital sample data communications receiver 10. The radio frequency signals received by the antenna 12 are coupled via line 13 as analog signals to a variable gain preamplifier 14 to provide a controlled level output signal on line 15 to power splitter 16. The RF analog signal on lines 17 and 18 are applied to a pair of mixers 19 and 21 connected to the real and imaginary channels I and Q respectively. A fixed frequency oscillator 22 has an output on line 23 which is connected to mixer 19 and to a 90° phase shifter 24 which provides a quadrature output on line 25 to mixer 21. The real analog RF signal on line 26 is applied to a single pole low pass filter 27 to provide a filtered analog output signal on line 28. The analog signal at the input of A to D converter 29 is converted to a digital output on line 31 which is applied to a finite impulse response (FIR) filter 32 to provide a filtered digital signal on line 33 which has some D.C. component that is removed by D.C. removal circuit 34 to provide the real digital signal on line 35. The real digital signal on line 35 is applied to a digital phase shifter 36 of the type set forth in my U.S. Pat. No. 4,841,552 to provide a phase shifted signal on line 37 shown as I'.

In a manner similar to that described above, the output signal on line 38 in the imaginary channel Q is applied to a low pass filter 39 whose output on line 41 is applied to an A to D converter 42. The digital output on line 43 is applied to a filter 44 and the filtered output on line 45 is applied to a D.C. removal circuit 46 to provide the imaginary digital signal Q on line 47. The imaginary signal Q on line 47 is applied to the digital phase shifter 36 of the type described in U.S. Pat. No. 4,841,552 to provide the phase shifted imaginary signal Q' on line 48. The real and imaginary signals on line 37 and 48 are connected to a preferred embodiment digital gain controller 11 to provide a digital gain command on line 49 which is shown connected to digital to analog converter 51. The analog output on line 52 is connected to the analog variable gain preamplifier 14 to control the output signal on line 15 at a predetermined controlled level. When the variable gain preamplifier is provided with a digital input, the digital gain command on line 49 may be coupled directly to the preamplifier 14 so as to eliminate the D to A converter 51. Clock strobe signals such as that shown on line 53 are applied to the digital blocks which occur after the A to D converters 29 and 42. The low pass filters 27 and 39 may be constructed as RC filter circuits and the FIR filters 32 and 44 may be constructed in the manner shown in my U.S. Pat. No. 4,808,939. It will be understood that all of schematic blocks shown in the FIG. 1 embodiment need not be constructed according to my previously mentioned patents but may be constructed by other equivalent circuits known in the prior art.

Figure 2:
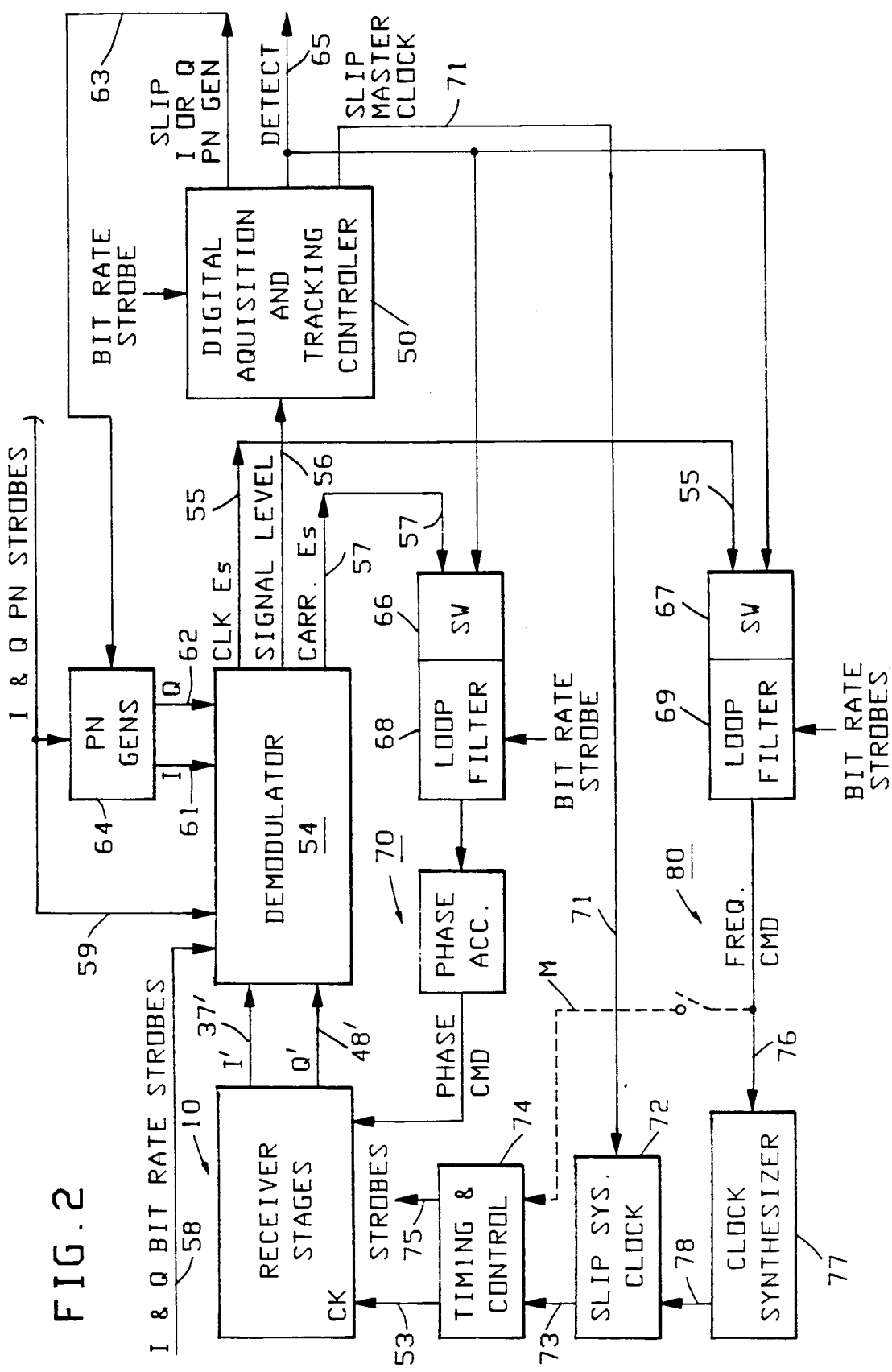
FIG. 2 is a schematic block diagram of a communications receiver showing the FIG. 1 pre-processing circuitry coupled to a demodulator and the present invention circuitry digital loop filter.

Refer now to FIG. 2 showing a schematic block diagram of a communications receiver which includes the FIG. 1 pre-processing circuitry coupled to a demodulator having output signals coupled to the circuitry for controlling the three tracking loops at four control points. The FIG. 1 receiver 10 is shown having phase rotated outputs 37' and 48, applied as inputs to a demodulator 54. The demodulator 54 of the present invention may be a commercially available demodulator or the demodulator described in our co-pending U.S. application Ser. No. 07/559,012 filed Jul. 26, 1990 entitled SIX CHANNEL DIGITAL DEMODULATOR. The demodulator 54 is shown having a clock error signal output on line 55, a signal level output on line 56 and a carrier error signal $E_s$ output on line 57. Demodulator 54 is shown having strobe and timing input signals on lines 58 and 59 and PN code sequence inputs on line 61 and 62 to be described in greater detail hereinafter.

The signal level on line 56 is indicative of the signal level of the despread data and is applied to the present invention digital acquisition and tracking controller 50. Digital acquisition and tracking controller 50 produces digital control signals on line 63 which are capable of slipping the PN generators which provide the I and Q PN codes on line 61 and 62. The PN timing strobes on line 59 are employed to control the PN generator and to advance the PN generator to the next sequential output. The preferred method of generating the slip of the I or Q PN generator is to delete one of the I or Q PN strobes.

Digital acquisition and tracking controller 50 is adapted to produce a detection signal on output line 65 which indicates the original acquisition correlation and is applied to the switches 66 and 67 at the input of the loop filters 68 and 69 to close the carrier recovery loop 70 and code tracking loop 80.

During initial acquisition the control signal on output line 71 is employed to slip the master clock or system clock 72 which produces the system clock signal on line 73 applied to the timing and control circuits 74 shown producing the sampling clock signal input on line 53 which is applied to the numerous components of the receiver stages 10. The sampling clock or system clock is the base clock signal employed to drive the receiver stages 10, the demodulator 54 and the digital acquisition and tracking controller 50. A plurality of strobe signals from the timing and control circuit 74 are shown on line 75 and will be explained in greater detail hereinafter. The code timing loop 80 is shown producing a frequency command signal on line 76 which is applied to the clock synthesizer 77 which produces a system clock signal on output line 78. It will be understood that the clock synthesizer 77 may be a commercially available component or produced as one of the components on the integrated circuit of the digital receiver. Further, the block 72 indicating that the system clock is being slipped actually occurs at the output of the clock synthesizer circuit 77 and is preferably not a part of the integrated circuit.

In the preferred embodiment of the present invention, the function of slipping the system clock is accomplished by deleting a predetermined quantity of system clock time equivalent to one-half of the time interval between PN strobe times. Further, the I and Q PN strobe times may be different. In the preferred embodiment of the present invention during initial acquisition of the data on the I or Q channel it is preferred that the clock signal be slipped because it is a finer increment of PN time and once the digital acquisition and tracking controller indicates that acquisition correlation has been obtained the switches 66 and 67 in the carrier recovery loop and code timing loops are closed. The digital acquisition and tracking controller 50 then attempts to acquire the other I or Q data channel by slipping the PN generator with the signal previously explained on line 63. Once the I and Q data channels have been acquired the digital acquisition and tracking controller will shift into the tracking mode which does not employ the control signals on lines 63 and 71. Bypass circuit M shown in phantom lines may optionally be employed when the input signal is not sampled synchronous to the PN chip rate.

Figure 3:
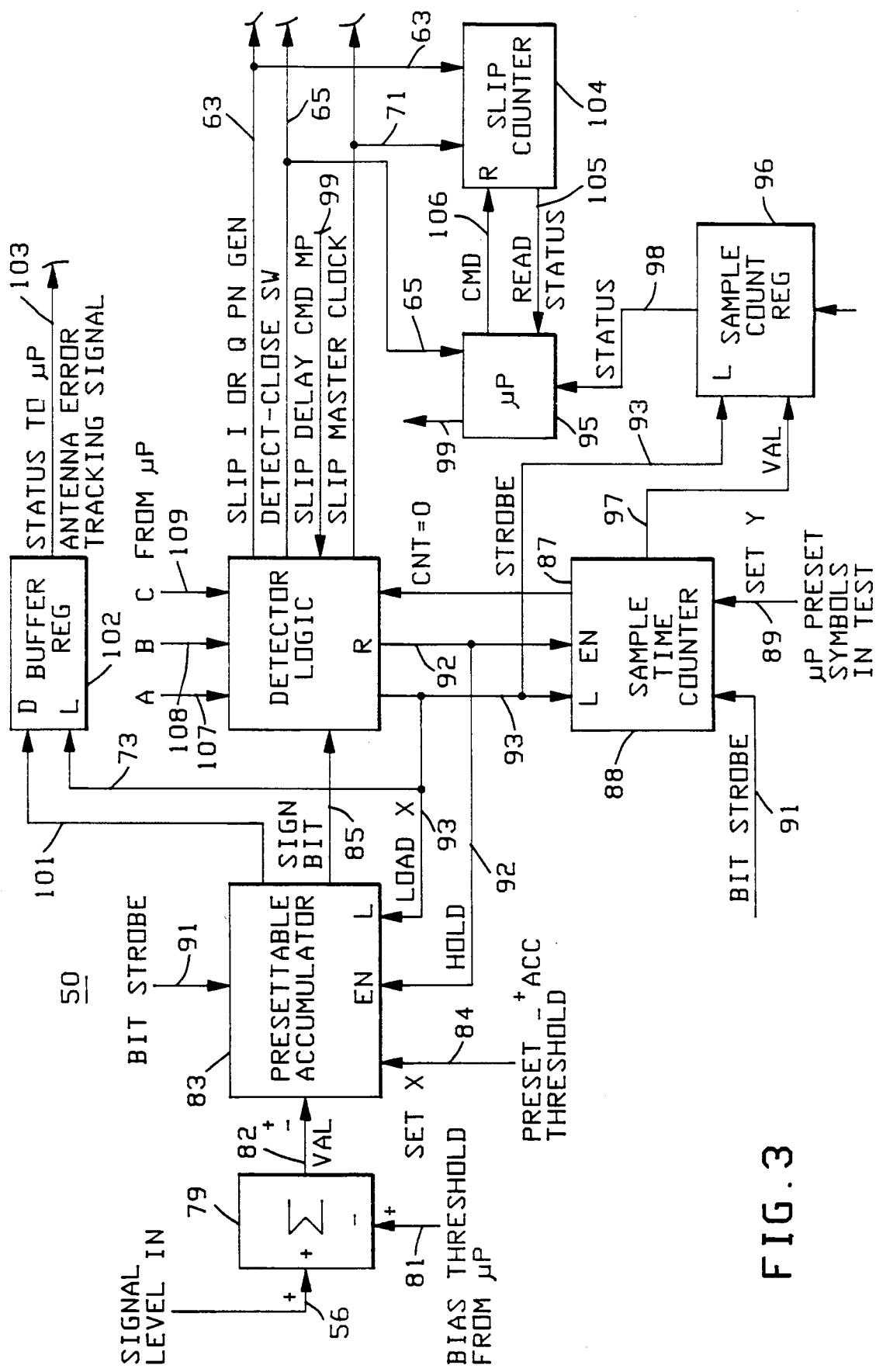
FIG. 3 is a detailed schematic block diagram of a preferred acquisition and tracking controller for generating signals used by the present invention loop filter.

Refer now to FIG. 3 showing a more detailed schematic block diagram of the preferred embodiment of the present invention programmable digital acquisition and tracking controller 50 having the aforementioned signal level input 56 applied to a positive terminal of summing circuit 79 which has as a second input a programmable bias threshold input applied to the negative terminal via line 81. The output on line 82 is the difference between the positive bias applied to the negative input 81 and the signal level applied to the positive input 56. The output may be a positive or a negative value which is applied to the accumulator 83 shown having a preset input line 84 which is programmably preset from the microprocessor.

Summing circuit 79 and accumulator 83 comprise a programmable signal level threshold detector adapted to produce a single bit decision output on line 85. This single bit decision is actually just the sign bit of accumulator 83. The sign bit transition on line 85 is produced when the data on line 82 causes the value in the preset accumulator 83 to change sign. The transition sign bit on line 85 is applied to the detector logic 86. Logic 86 is also monitoring the count zero that appears on line 87 after a predetermined time period that has been set in the sample time counter 88 from the programmable microprocessor on line 89. The programmable count set on line 89 is not counted by the bit strobe on line 91 until enabled by the signal on line 92 from the detector logic 86. The enable signal on line 92 is applied as a hold enable signal to the accumulator 83 which is loaded by the reset signal produced on line 93 from the detector logic 86. The signal on line 93 loads the value X in the accumulator 83 at the same time the value Y is loaded into the sample time counter 88. The hold signal on line 92 is only used during the acquisition mode and will now be explained in greater detail.

First assume that the detector logic 86 has determined an acquisition correlation condition in which acquisition has not occurred as indicated by a negative sign bit on line 85 which occurs prior to the count equal zero on line 87. On the first occurrence of such non-acquisition correlation, a control signal is produced on line 71 also shown in FIG. 2 which causes the timing and control signals to slip the master or system clock. During the time that the controller 50 is waiting for the effect of the slipped master or system clock to feed back to the signal level 56, line 92 holds the accumulator 83 and the sample time counter 88 at their last values. After a predetermined amount of time set by the detector logic 86, the hold signal on line 92 is released to permit initialization of the values on lines 84 and 89 into the accumulator 83 and sample time counter 88. The detector logic 86 subsequently produces the load X signal and load signal on 93 to the accumulator 83 and counter 88 so that they are initialized to their preset values. In the preferred embodiment acquisition correlation mode, the presetable accumulator 83 and sample time counter 88 are reinitialized and the master or system clock slipped until the sign bit on line 85 remains positive at the time the count equals zero on line 87 indicating that initial acquisition correlation has occurred which causes the control signal on line 65 to raise a detect signal which closes the aforementioned switches 66 and 67 in the carry recovery loop 70 and code timing loop 80. The status or condition of the system is indicated to the microprocessor 95 via line 65. The microprocessor ten reinitializes all of the programmable elements in the of the programmable elements in the controller 50 and may start a new acquisition of a different data channel or enter the tracking mode. Assume that the first acquisition correlation was indicative of the PN signal on line 61 acquiring the I channel data on line 37' then the normal procedure would be to acquire the PN code on line 48' using the PN generator signal on line 62 and once this has occurred the controller 50 will enter the tracking mode which will be described hereinafter.

Assume now that the controller 50 has entered the tracking mode and the programmable inputs to the components of the controller have been preset by the microprocessor. Now the value on line 82 is expected to be positive, accordingly, the initial preset condition on line 84 is a negative value. If tracking correlation has been maintained, the sign bit on line 85 is now expected to go positive before the count equals zero on line 87 indicating that tracking mode is being maintained. The preset values in the threshold stages 79 and 83 are maintained and the detector logic 86 reinitializes a subsequent tracking verification by going through the whole process again looking for the positive sign bit on line 85 to occur before the count equals zero on line 87. The high speed lower level detector logic 86 can continue to monitor the tracking correlation independent of external microprocessor controls, however, should the sign bit on line 85 be low at the time the count equals zero on line 87, the detector logic 86 senses that tracking correlation has been lost and causes the control signal on line 65 to go low and informs the microprocessor 95 of its status via line 65 which now takes over as the detector logic 86 raises a hold signal on line 92. Now the microprocessor 95 can again reprogram the programmable elements of the controller 50 and either perform an acquisition mode operation or another track mode operation employed for verification. In the present invention it is possible to employ a similar type of verification during acquisition without allowing any slip of the master clock or the PN generators. A feature of the present invention is that the load or hold signal on line 93 is applied as a strobe load signal to the sample count register 96 which loads or reads the value of the sample in the down counter 88 at the time the hold signal occurs. This value on line 97 is held in the register 96 and provides a status to the microprocessor 95 via line 98 that is useful for the microprocessor to determine if the bias and preset thresholds on lines 81 and 84 need to be changed. It will be understood that the time counter 88 is used for both acquisition and tracking correlation but the microprocessor status line 98 is only used during acquisition correlation. The previously mentioned hold time on line 92 may be changed or re-programmed by the microprocessor 95 via line 99.

A feature of the present invention is that the controller 50 is capable of producing a signal indicative of low frequency AM modulation on the signal level at line 56. By taking the value in the accumulator 83 via line 101 and applying it to the data input of a buffer register 102 which is loaded during the tracking mode by line 93. The loaded value may be read via line 103 to the microprocessor and used by the microprocessor to generate an antenna error tracking signal.

During acquisition each time the master or system clock or the PN generator is slipped the signals on lines 71 and 63 increment a slip counter 104 which count is applied via line 105 to the microprocessor 95 as a status symbol. The slip counter 104 may be reset by a microprocessor command on line 106 which initializes the slip counter to zero with a reset input. The status signal on line 103 is used for several conditions, the most important being that detection of an excessive slip count after a predetermined period is indicative of having searched the entire PN code without achieving acquisition correlation. Thus, the status conditions monitored by the microprocessor permits the microprocessor to make decisions to modify the programmable parameter of the entire communications receiver as well as the programmable controller 50. Three of the direct programmable inputs to the detector logic 86 from the microprocessor 95 are shown as conditions A, B and C from the microprocessor on lines 107, 108 and 109 respectively. The control signal on line 107 is used to initialize acquisition or tracking. The control signal on line 108 is employed to set the detector logic 86 to the acquisition or tracking mode. The control signal on line 109 is employed to enable either the slip control signals on line 63 or 71 which slip the IPN generator, or the QPN generator, or the master system clock.

It will be appreciated that the detector logic 86 is lower level hardware that is a fast acting controller and that the higher level microprocessor 95 is slower but is more flexible and is software programmable. The externally programmable microprocessor 95 may be easily adapted to numerous acquisition and tracking requirements without any hardware change. For example, the condition indicative of acquisition correlation or tracking correlation may be verified through a confidence algorithm stored in the microprocessor 95. Further, the microprocessor may be employed as a higher level monitor which is capable of reprogramming the controller 50 to achieve optimum conditions throughout the controller 50. The higher level microprocessor 95 upon receiving a condition indicative a loss of tracking by a low signal on line 65 may make more than one decision as to which remedial measure will be taken. Thus, the novel controller 50 is capable of reprogramming itself if acquisition and/or tracking correlation is not achieved.

Figure 4:
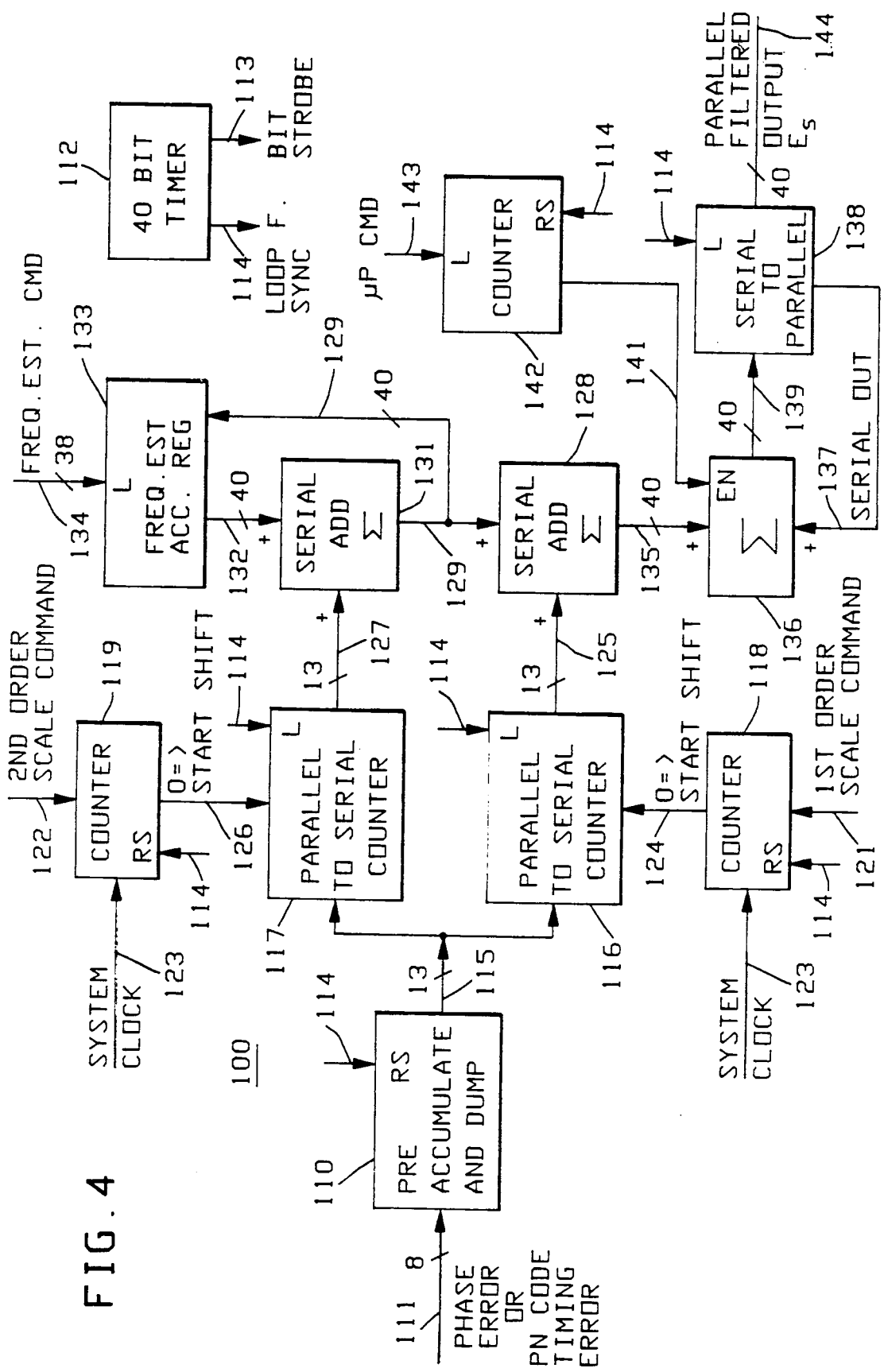
FIG. 4 is a detailed schematic block diagram of a preferred embodiment of the present invention programmable digital loop filter.

Refer now to FIG. 4 showing a detailed schematic block diagram of a preferred embodiment programmable digital second order loop filter 100. Before describing the novel filter it should be noted that filter 100 may be used in the FIG. 2 carrier recovery loop 70 and code timing loop 80 as loop filters 68 and 69. Thus, the input to these filters has already passed through switches 66 and 67 and is presented on line 111 as the phase error signal or PN code timing error signal to the respective loop filter 68 or 69. The error signal on line 111 is applied to a pre-accumulate and dump circuit 110 which is not required if the bit strobe timing rate on line 113 to the 40 bit timer 112 is equal to or less than 40 clock cycles which is the loop filter sync pulse at the output of the timer 112 on line 114. The loop filter sync pulse is applied via line 114 to the restart input of the pre-accumulated and dump circuit 110 to produce a 13 bit output on line 115 which is applied to the inputs of the first and second parallel-to-serial converters 116 and 117. The parallel-to-serial converters 116 and 117 are shown having programmable inputs each of which comprise presettable counters 118 and 119 shown having respective first order scale command inputs and second order scale command inputs which are programmable from a remote microprocessor (not shown) on their lines 121 and 122. The presettable counters are shown having system clock inputs 123 and loop filter sync inputs on their lines 114 which restart the counters 118 and 119 respectively. The output of the first order counter 118 on line 124 delays the output of the parallel-to-serial converter 116 while the preset counter is counting down to zero and starts the serial output at the count of zero on line 125. Similarly, the output on line 126 delays the output of the counter 117 until a count zero is reached and starts the shifting of the information to its output line 127. The effect of delaying the start of the shifting out of the data in the converters 116 and 117 is to multiply the output data by a power of two for each of the shift positions. A first programmable one bit serial adder 128 is shown receiving the 13 bit input on line 125 and a second input on line 129 from a second programmable one bit serial adder 131. The second serial adder 131 receives a 40 bit programmable input on line 132 from a programmable accumulator register 133 which has a microprocessor frequency estimate command input on line 134 and a serial data input from line 129. The second order stage receives a 38 bit frequency estimate command which is loaded into the frequency estimate accumulator register 133 and presented as a serial 40 bit output on line 132 to a positive input of the second order serial adder 131. The output of the second order serial adder 131 on line 129 is recirculated back on line 129 as part of the accumulation and is also provided as an input to the first order serial adder 128. The output of the first order serial adder 128 on line 135 is provided as an input to the summing circuit 136 of the programmable output means. The second input to the summing circuit 136 on line 137 is provided from the serial to parallel converter 138 which receives the output of the summing circuit 136 on line 139. Stated differently, the output from the summing circuit 136 which is not to be used is circulated through the serial-to-parallel register 138 and added back in to the next 40 bit sample or result of the next sample or result, thus, the effect is to ripple the precision of the lower unused bits into the higher order used bits so as to avoid the truncation error which would result in a half bit error to the least significant bit used in the output. The proper sequence for producing a shortened output on parallel filtered output line 144 starts by loading a command in counter 142 which raises a count enable signal on line 141 to permit the recirculation of information on line 137 to enter the summing circuit 136 and produce the 40 bit output on line 139 which is loaded into the serial-to-parallel register 138. Thus, the error signal output on line 144 has its accuracy preserved even though the output comprises fewer than 40 significant bits. In this manner the output on line 144 has an average quantization error of one-half of one bit of the 40 bit output on line 135. Stated differ-ently the novel loop filter structure 100 allows the loop filter to maintain 40 bit accuracy and integrity while reducing the number of output bits on line 144.

Having explained a preferred embodiment digital loop filter 100, it will be understood that the second order loop filter 100 may be programmed to operate as a first order loop filter by disabling the second order stage counter 119 and converter 117 and reducing the gain to zero. Thus, the first and second input stages are shown to be programmable and the first and second order serial adders 128 and 131 are shown to be programmable at their outputs and inputs respectively. The bit strobe time on line 113 may be made faster or slower than the 40 clock cycle time required to perform the 40 bit addition in the loop filter 100. In the faster case the pre-accumulate and dump circuit 110 is a required buffer to synchronize the loop filter system otherwise the pre-accumulate and dump circuit is not required.

What is claimed is:

1. A programmable digital loop filter of the type employed in communications receivers, comprising:
   first and second programmable scaling means each having input means for receiving parallel input error signals and producing serial output error signals,
   first and second programmable serial adder means coupled to the respective serial outputs of said first and second programable scaling means each said adder having a second adder input,
   the second adder input of said first serial adder means being coupled to the output of said second serial adder means,
   programmable input register means having a frequency estimate input,
   the second adder input of said second serial adder means being coupled to an output of said programmable input register means,
   programmable output stage means,
   the output of said first serial adder means being coupled to said programmable output stage means for providing output filtered error signals having the accuracy of the full width of the error signal data being serially added in said first and second serial adder means.

2. A programmable digital loop filter as set forth in claim 1 wherein said first and second serial adder means each comprises one bit serial adders.

3. A programmable digital loop filter as set forth in claim 2 wherein said first and second programmable scaling means each comprises parallel-to-serial converters coupled to said parallel input error signals and having outputs coupled to said first and said second one bit serial adders respectively.

4. A programmable digital loop filter as set forth in claim 3 wherein each said first and said second programmable scaling means further includes programmable scaling counter means coupled to said parallel-to-serial converters for determining the number of bits of delay being imparted to said input data before being applied to said first and said second one bit serial adder means for determining the scale factor or gain of said loop filter.

5. A programmable digital loop filter as set forth in claim 4 which further includes microprocessor command means coupled to said programmable scaling counter means for programming said parallel-to-serial converters.

6. A programmable digital loop filter as set forth in claim 1 wherein said programmable input register means comprises a microprocessor programmable frequency estimate accumulator register.

7. A programmable digital loop filter as set forth in claim 6 which further includes microprocessor command means coupled to said programmable register means for setting an initial value in said second order programmable one bit serial adder means.

8. A programmable digital loop filter as set forth in claim 1 wherein said programmable output stage means comprises a programmable summing circuit coupled to the output of said first programmable one bit serial adder means.

9. A programmable digital loop filter as set forth in claim 8 wherein said programmable output stage means further comprises a serial to parallel converter coupled to the output of said programmable summing circuit.

10. A programmable digital loop filter as set forth in claim 9 wherein said programmable output stage means further comprises programmable counter means having an input coupled to said microprocessor command mean and an output coupled to said programmable summing circuit to for enabling an input to said summing circuit whereby said programmable counter is enabled for a predetermined number of least significant bits not employed as an output bit from said output stage means.

11. A programmable digital loop filter as set forth in claim 10 wherein the value of the bits programmable into said counter means comprises the full bit width of the loop filter minus the number of output bits to be used as an output from said output stage means of said loop filter.

12. A programmable digital loop filter as set forth in claim 11 wherein said serial-to-parallel converter of said output stage means comprises a serial output coupled to a second input of said summing circuit for preserving the quantization error to one-half of one bit of the least significant bit of the full bit width of the loop filter.

13. A programmable digital loop filter as set forth in claim 1 which further includes an overflow accumulator buffer connected in series with said input data stream and said first and second programmable scaling means for providing an average input data value to said loop filter.

* * * * *